(12) United States Patent
Pflaumer

(10) Patent No.: US 6,337,645 B1
(45) Date of Patent: Jan. 8, 2002

(54) FILTER FOR DIGITAL-TO-ANALOG CONVERTERS

(75) Inventor: Michael W. Pflaumer, Berkeley, CA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/521,503

(22) Filed: Mar. 9, 2000

Related U.S. Application Data

(60) Provisional application No. 60/125,726, filed on Mar. 23, 1999.

(51) Int. Cl.[7] .............................. H03M 3/00; H03M 1/66
(52) U.S. Cl. ......................... 341/143; 341/155; 341/144
(58) Field of Search ................................. 341/126, 180, 341/118, 61, 155, 143, 110

(56) References Cited

U.S. PATENT DOCUMENTS

| | | | | |
|---|---|---|---|---|
| 5,079,734 A | * | 1/1992 | Riley | 708/313 |
| 5,235,534 A | * | 8/1993 | Potter | 708/300 |
| 5,384,869 A | * | 1/1995 | Wilkinson et al. | 382/56 |
| 5,479,168 A | | 12/1995 | Johnson et al. | 341/110 |
| 5,512,898 A | * | 4/1996 | Norsworthy et al. | 341/155 |
| 5,529,068 A | * | 6/1996 | Hoenninger, III et al. | 324/309 |
| 5,657,261 A | * | 8/1997 | Wilson et al. | 341/61 |
| 5,717,618 A | * | 2/1998 | Menkhoff et al. | 341/61 |
| 5,781,137 A | * | 7/1998 | Knudsen | 341/118 |
| 5,808,574 A | | 9/1998 | Johnson et al. | 341/110 |
| 5,835,043 A | * | 11/1998 | Tsuchida et al. | 341/143 |
| 5,935,199 A | * | 8/1999 | Del Signore | 708/313 |
| 5,963,160 A | * | 10/1999 | Wilson et al. | 341/143 |
| 6,023,191 A | * | 2/2000 | Connell et al. | 327/554 |

FOREIGN PATENT DOCUMENTS

WO     WO 95/24768     9/1995

OTHER PUBLICATIONS

International Search Report for PCT/US00/07407—Documents Considered to be Relevant, (Jul. 6, 2000).
Alex Sherstinsky and Charles G. Sodini—"A Programmable Demodulator for Oversampled Analog–to–Digital Modulators", IEEE Transactions on Circuits and Systems 37 (1990) Sep., No. 9, New York, US, pp. 1092–1103.
M. Barmettler and P. Gruber, "Increase of Resolution of Digitally Acquired Data by Means of Oversampling Methods", TM Tchnisches Messen 59 (1992) Jan., No. 1, Munchen, DE, pp.21–15.

* cited by examiner

Primary Examiner—Peguy JeanPierre
Assistant Examiner—Jean Bruner JeanGlaude
(74) Attorney, Agent, or Firm—Lee & Hayes, PLLC

(57) ABSTRACT

An analog-to-digital converter responsive to an analog signal converts the analog signal to a digital signal. A digital decimation filter, having an associated frequency response, is responsive to the digital signal for producing a decimated digital signal. An alias correction filter attenuates the decimated digital signal to remove distortion. A digital interpolation filter, having an associated frequency response, is responsive to the alias-corrected signal for producing an interpolated digital signal which subsequently is converted to an analog signal by a digital-to-analog converter. The alias correction filter has a frequency response that attenuates the decimated digital signal in a frequency range generally corresponding to a distortion portion that is present within the combination of the digital decimation filter frequency response and the digital interpolation filter frequency response.

40 Claims, 10 Drawing Sheets

FILTER FOR DIGITAL-TO-ANALOG CONVERTERS

RELATED APPLICATION

This application claims the benefit of provisional application Ser. No. 60/125,726, filed on Mar. 23, 1999.

BACKGROUND OF THE INVENTION

1. Field of the Invention

The invention relates generally to improvements in digital-to-analog (D-to-A) conversion, and, more particularly, to improvements in such conversion for audio signals. It is most useful in high quality audio for music reproduction in devices such as Compact Disc (CD) players, DVD players, etc.

2. Description of Related Art

Essentially all modem analog-to-digital (A-to-D) and D-to-A converters used for audio operate at a sample rate higher than the output/input sample rate. These converters are known as over-sampling converters, and they use digital filters to decimate down to the output sample rate in the case of A-to-D converters and to interpolate up from the input sample rate in the case of D-to-A converters. An important reason for this configuration is that filters are necessary to minimize distortions present in both A-to-D and D-to-A conversion processes caused by unwanted frequencies, and digital filters are more stable, more reproducible, and less expensive to implement than analog filters of an equivalent quality. FIG. 1a is a simplified block diagram of an A-to-D converter and FIG. 1b is a simplified block diagram of a corresponding D-to-A converter.

The actual sampling rate for the converters themselves in over-sampling digital converters may be many times higher than the input/output sample rate. The decimation or interpolation process is normally done in several stages, with the last decimation filter and the first interpolation filter normally done with a two-to-one frequency ratio. These filters for the last/first operations have the most effect on the sonic performance of audio converters because their cutoff frequencies are close to the frequencies in the program material. FIG. 2a shows the frequency response of a typical filter used in an A-to-D converter as the final decimation filter. FIG. 2b shows the response of a typical filter used in a D-to-A converter as the first interpolation filter. The Y-axis of the graphs shows the magnitude of the amplitude response of the filters in decibels, and the X-axis shows the frequency as a fraction of the output/input sampling rate, Fs. The reason that we need to examine both the A-to-D and D-to-A filters is that they function as a system in determining the effects of several distortions in the output signal 180 (FIG. 1b).

The frequency 0.5 in the middle of the graphs (FIGS. 2a and 2b), the Nyquist frequency, has a special significance. It is important because the sampling theorem states that in a sampled data system, frequencies above one half the sampling frequency cannot be uniquely represented by the sampled data stream, in the case of the A-to-D converter, any frequencies above the Nyquist frequency in the input signal that are not removed by the decimation filter appear as spurious frequencies in the output known as alias frequencies or alias distortion. The ideal decimation filter from an alias distortion perspective would pass all frequencies below 0.5 Fs and no energy above a frequency of 0.5 Fs. Such a filter is not realizable in practice, but practical filters usually try to approximate the ideal response. Any residual frequencies above Nyquist in the original signal fold over or alias into frequencies below Nyquist in the output signal 120 (FIG. 1a), with the relationship that a frequency f in the input 90 becomes Fs-f in the output 120.

An alias distortion mechanism also exists in D-to-A converters in the interpolation process. The incoming digital signal 122 (FIG. 1b) can be considered to have no frequencies above 0.5 Fs. The first stage of interpolation consists of adding zero value samples in between each of the original samples to double the sample rate and then passing the result through a low pass filter with a frequency response such as in FIG. 2b. The result is that the zero valued samples are replaced by values that are interpolated from the surrounding data.

The distortion arises from the fact that new frequencies are created above the original Nyquist frequency and that these new frequencies correspond to frequencies present in the original signal. In order to analyze the potential impact of this distortion, it is useful to graph the composite frequency response of the decimation/interpolation system. If one takes the frequency response of the A-to-D decimation filter in FIG. 2a and performs the equivalent decimation followed by inserting the zero value samples prior to the interpolation filter, one gets a frequency response shown in FIG. 3a. For each frequency below the Nyquist 200, a new frequency above Nyquist is created. These have the same relationship, i.e., f_new equals FS-f, that alias products have in the A-to-D case, as can be seen from the symmetry about Nyquist 200. These new frequencies, f_new, are uniquely represented because the sampling rate is now twice as great.

If one now adds the cascade of the interpolation filter response of FIG. 2b, one gets the composite response shown in FIG. 3b. The frequencies above 0.5 are signals which were not there in the original signal and are alias distortion products. They fall into two general groups: those corresponding to the stop band of the interpolation filter 220, and those associated with the transition band behavior of both the decimation and interpolation filters 210.

Many people consider these distortion products to be of little importance because they are extra signals above the band of interest and are inaudible in the case of a CD or any other system with a sampling rate greater than 40 kHz. If everything in the audio system following the interpolation filter were really linear, this would be true. Unfortunately, the real world is not strictly linear. Non-linearities exist in the D-to-A converter, small signal amplifiers, power amplifiers, loudspeakers, and even human hearing.

In FIG. 3b, the acceptable level of stop band distortion products 220 determine the stop band performance requirement for the interpolation filter. The only way to reduce these distortions is to improve the performance of the interpolation filter stop band rejection.

The transition band distortions at 210 are more limited in frequency range, but they have much higher amplitude and can cause really audible problems in the output of a system. As an example, consider a cymbal crash in music, which generates large amplitude high frequency components. For each component just below Nyquist, there is a corresponding one at a mirror image frequency above Nyquist, and each pair of original frequency and alias frequency will generate a difference component when it encounters a non-linearity later in the system. In the case of a CD system with these filters, these difference components are in the frequency range of 0 to 5 kilohertz, where human hearing is very sensitive and where they are not masked very well by the signal that created them. They result in a "dirty" sound to the cymbals, which is very typical of digital systems.

Transition band distortions 210 result primarily from the transition band behavior of the interpolation filter. The type of filter that is normally used in this position in a system design is called a half-band filter. As can be seen from FIG. 2b, it is 6 dB down at Nyquist with considerable response above the 0.5 frequency. It is used in most systems because it is very economical to implement computationally, and because it has good time domain behavior. It is a symmetrical finite impulse response (FIR) filter with linear phase response in which all even order coefficients except the middle one are exactly zero, and therefore, those multiplications do not have to be performed. This type of filter is used on the vast majority of commercial D-to-A converters designed for audio use.

A prior art approach to solving the problems associated with half-band interpolation filters is covered in U.S. Pat. Nos. 5,479,168 and 5,808,574 and related materials. The solution that is optimal from a performance point of view is to use an interpolation filter which starts to attenuate at a lower frequency and is therefore not a half-band filter. It is possible to dramatically reduce the amplitude of the transition band alias components 210 while still maintaining good time domain impulse response by using a filter which is complementary to the decimation filter used in the A-to-D converter. It is also possible to control the stop band performance to any desired level. This approach has two major disadvantages in many commercial applications.

The first disadvantage is cost. The complexity of a non-half-band filter appropriate for this application is usually more than twice as great as the corresponding conventional half-band filter. This translates directly into silicon area, and hence cost, in a hardware implementation.

The second disadvantage is that the output sample rate of the better interpolation filter is two times the Fs of the input and a D-to-A converter following the filter must be able to accept the higher sampling rate. Since most converters used in modern equipment are really combination filter/D-to-A converters they may not accept the higher sample rate.

SUMMARY OF THE INVENTION

Briefly, and in general terms, the present invention provides a method for and a system of processing a digitally encoded signal that eliminates a type of alias distortion arising from the transition band behavior of half-band interpolation filters commonly used in D-to-A converters. The invention also provides a method for designing filters that reduce alias distortion for use with D-to-A converters.

In a first aspect, the invention involves a method of processing an analog signal. The method includes the steps of converting the analog signal to a digital signal using an analog-to-digital converter, filtering the digital signal using a digital decimation filter having an associated frequency response and subsequently filtering the digital signal through a digital interpolation filter having an associated frequency response. In accordance with the present invention, the method further includes the step of, prior to filtering the digital signal through the digital interpolation filter, locating the transition band portion of the frequency response resulting from the combination of the digital decimation filter frequency response and the digital interpolation filter frequency response and attenuating the digital signal in a frequency range generally corresponding to the transition band portion.

By attenuating the digital signal in this manner and prior to filtering the digital signal through the interpolation filter, the method of the present invention substantially eliminates the transition-band alias distortion associated with presently known D-to-A conversion processes without altering the interpolation filtering process itself.

In a detailed aspect of the invention, the method further includes the step of performing additional signal processing on the digital signal prior to the step of attenuating the digital signal in a frequency range generally corresponding to the transition band portion. In another detailed facet, the method further includes the steps of performing data compression on the digital signal after the step of filtering the digital signal using a digital decimation filter. Further included is the step of subsequently performing data expansion of the digital signal prior to the step of attenuating the digital signal in a frequency range generally corresponding to the transition band portion.

In a second aspect, the invention is related to a system for processing an analog signal. The system includes an analog-to-digital converter responsive to the analog signal for converting the analog signal to a digital signal. The system also includes a digital decimation filter having an associated frequency response. The digital decimation filter is responsive to the digital signal for producing a decimated digital signal. The system also includes a digital interpolation filter having an associated frequency response. In accordance with the present invention, the system further includes an alias correction filter that is responsive to the decimated digital signal for producing an alias-corrected signal. The alias correction filter has a frequency response that attenuates the decimated digital signal in a frequency range generally corresponding to a distortion portion that is present within the combination of the digital decimation filter frequency response and the digital interpolation filter frequency response. The digital interpolation filter is responsive to the alias-corrected signal for producing an interpolated digital signal.

In a detailed aspect of the invention, the digital decimation filter includes a series of individual digital decimation filters and the distortion portion of the frequency response is present within the frequency response resulting from the combination of the frequency response of the last digital decimation filter in the decimation-filter series and the digital interpolation filter frequency response. In another detailed facet, the digital interpolation filter includes a series of individual digital interpolation filters and the distortion portion of the frequency response is present within the frequency response resulting from the combination of the frequency response of the first digital interpolation filter in the interpolation-filter series and the digital decimation filter frequency response. In yet another detailed aspect the system further includes a signal processor responsive to the alias corrected signal for providing a processed alias-corrected signal. In still another detailed facet, the system further includes a data compressor responsive to the decimated digital signal for performing data compression on the signal and a data expander responsive to the compressed decimated digital signal for performing data expansion on the signal.

In a third facet, the invention involves a method of processing a digital signal converted from an analog signal. The digital signal is converted using a digital decimation filter having an associated frequency response. The method includes the steps of filtering the digital signal through a digital interpolation filter having an associated frequency response. In accordance with the present invention, the method further includes the step of locating a distortion band portion of the frequency response resulting from the combination of the digital decimation filter frequency response and the digital interpolation filter frequency response and attenuating the digital signal in a frequency range generally corresponding to the located distortion band portion. This attenuation is preformed prior to the step of filtering the digital signal through the digital interpolation filter.

In a detailed aspect of the invention, at least one of a plurality of signal processing characteristics are encoded in the digital signal and the method further includes the step of decoding the signal processing characteristic from the digital signal. This decoding is performed prior to the step of attenuating the digital signal in a frequency range generally corresponding to the distortion band portion. The signal processing characteristic is selected from the plurality of signal processing characteristics based on a hidden code carried by the digital signal.

In a fourth aspect, the invention is related to a system for processing a decimated digital signal converted from an analog signal using a digital decimation filter having an associated frequency response. The system includes a digital interpolation filter having an associated frequency response and an alias correction filter responsive to the decimated digital signal for producing an alias-corrected signal. The alias correction filter has a frequency response that attenuates the decimated digital signal in a frequency range generally corresponding to a distortion band portion that is present within the combination of the digital decimation filter frequency response and the digital interpolation filter frequency response. The digital interpolation filter is responsive to the alias-corrected signal for producing an interpolated digital signal.

In a fifth aspect, the invention is related to a method of processing a digital signal converted from an analog signal using a selected one of a plurality of digital decimation filters, each having an associated frequency response. The decimation filter is selected based on a hidden code carried by the digital signal. The method includes the steps of providing a digital interpolation filter and providing a plurality of individually selectable alias correction filters. Each alias correction filter is designed to attenuate a digital signal in a frequency range corresponding to a distortion band portion that is present in the frequency response resulting from the combination of the frequency response of one of the digital decimation filters and the frequency response of the digital interpolation filter. The method further includes the step of selecting one of the alias correction filters based on the hidden code, filtering the digital signal through the selected alias correction filter and filtering the digital signal through the digital interpolation filter.

In a sixth facet, the invention is related to a system for processing a digital signal converted from an analog signal using a selected one of a plurality of digital decimation filters, each having an associated frequency response. The choice of decimation filter is conveyed in a hidden code carried by the digital signal. The system includes a digital interpolation filter and a plurality of individually selectable alias correction filters, each of which are designed to attenuate a digital signal in a frequency range corresponding to a distortion band portion. The distortion band portion is present in the frequency response that results from the combination of the frequency response of one of the digital decimation filters and the frequency response of the digital interpolation filter. The system further includes a selector responsive to the hidden code for selecting one of the alias correction filters. In accordance with the present invention, the selected alias correction filter is responsive to the digital signal prior to the digital interpolation filter.

In a seventh aspect, the invention is related to a method of designing a filter that reduces alias distortion for use in processing a digital signal which has been converted from an input analog signal using an analog-to-digital converter having a digital decimation filter. The digital signal being subsequently converted to an output analog using a digital-to-analog converter comprising a digital interpolation filter. Each of the decimation and interpolation filters have an associated frequency response. The method includes the steps of a) locating a distortion band portion of the frequency response resulting from the combination of the digital decimation filter frequency response and the digital interpolation filter frequency response; b) selecting a first attenuation filter having a first frequency response that attenuates the digital signal in the frequency range generally corresponding to the distortion band portion; c) convolving the impulse responses of the decimation filter and the interpolation filter to produce a first impulse response; and d) convolving the impulse responses of the decimation filter, the attenuation filter and the interpolation filter to produce a second impulse response.

The method further includes the steps of e) comparing the time dispersion of the second impulse response in the most sonically significant region with the time dispersion of the first impulse response in the same region; f) if the width of the second-impulse-response time dispersion in the most sonically significant region is generally greater than the width of the first-impulse-response time dispersion in the same region, selecting another attenuation filter having a frequency response different then the first frequency response, that attenuates the digital signal in the frequency range generally corresponding to the distortion band portion; and g) repeating steps d, e and f until the width of the second-impulse-response time dispersion in the most sonically significant region is no greater than the width of the first-impulse-response time dispersion in the same region.

By considering both the frequency-domain response and time-domain response of the system when designing an alias-distortion reduction filter, the present invention can eliminate the alias distortion associated with D-to-A converters without significantly changing the time-domain response of the system.

In a detailed aspect of the invention, the convolved impulse response is plotted on a logarithmic scale. In another detailed facet, the most sonically significant region of the convolved impulse response is the region above minus 80 dB. In yet another detailed aspect, the higher amplitude regions of the first and second impulse responses are considered to be more sonically significant.

BRIEF DESCRIPTION OF THE DRAWINGS

FIG. 3b depicts the frequency response obtained by cascading the frequency response of the D-to-A interpolation filter response of FIG. 2b with the response of FIG. 3a;

DETAILED DESCRIPTION OF THE PREFERRED EMBODIMENTS

Figure 4:
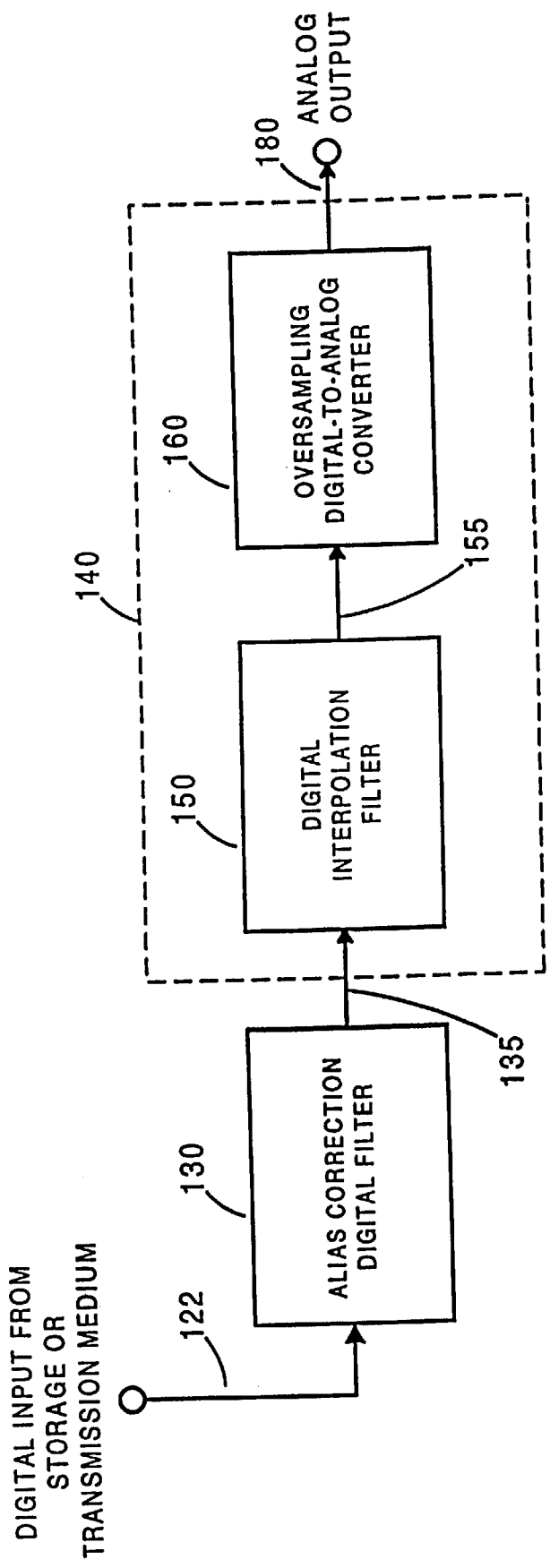
FIG. 4 is a block diagram of a system in accordance with the present invention which includes an alias correction filter positioned before a D-to-A converter system.

Referring now to the drawings, wherein like reference numerals denote like or corresponding parts throughout the drawing figures, a D-to-A converter system in accordance with the present invention is shown in FIG. 4.

The original D-to-A converter structure is shown enclosed in a dashed line 140, and in many commercial applications, several channels of this type are integrated on a single integrated circuit (IC). The added filter 130 of the invention is placed in the input stream to the original converter. This filter 130 is referred to herein as an "1xFs alias correction filter." It is important to note that the input 122 and the output 135 of the alias correction filter 130 are at the same sample rate Fs and that is why it is called a 1xFs alias correction filter.

Figure 5A:
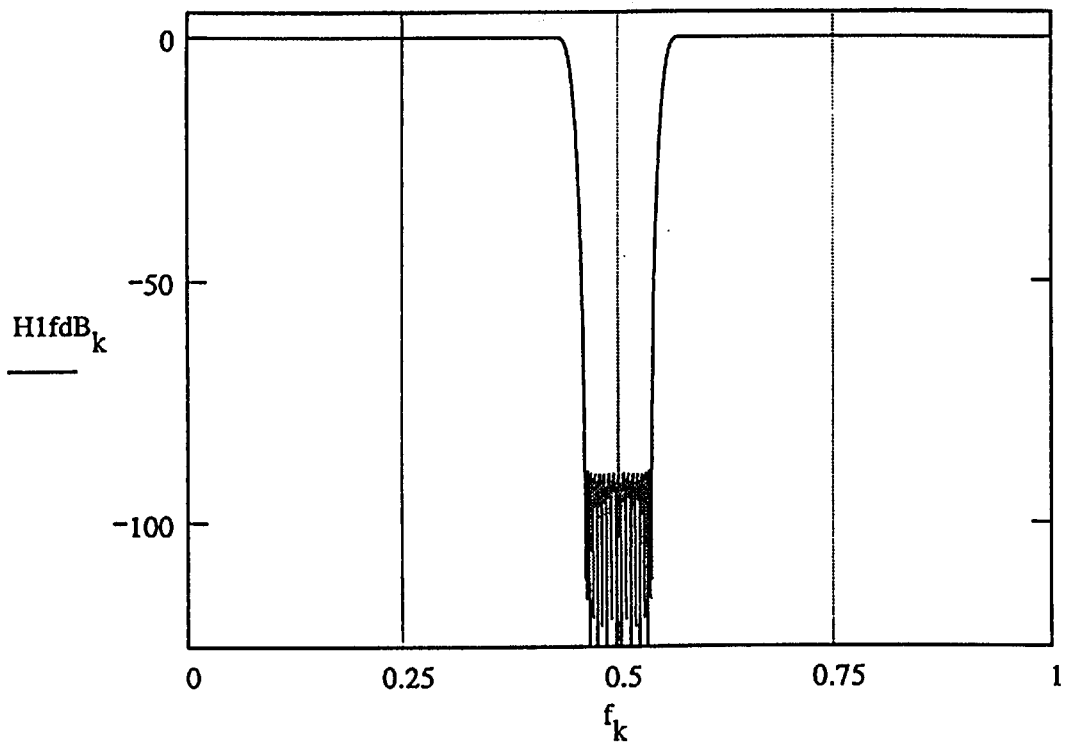
FIG. 5a depicts an exemplary frequency response of the alias correction filter of FIG. 4.

The frequency response of a typical instance of this filter is shown in FIG. 5a. It is a low-pass filter that attenuates only the frequencies in the input signal which are very near Nyquist. The plot of the filter is shown with the zero samples inserted, ready for interpolation, to make its relationship to the other plots clearer. The instance of the filter that is shown is a symmetrical FIR filter, which has linear phase response. Because it is operating at Fs, only the frequency response up to 0.5 Fs is necessary to specify its behavior.

Figure 1A:
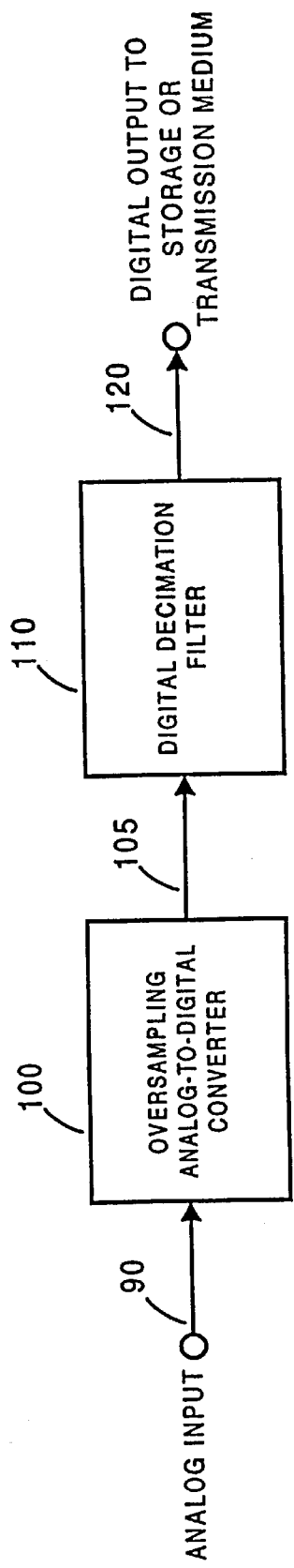
FIG. 1a is a block diagram of a prior-art analog-to-digital (A-to-D) converter.
Figure 1B:
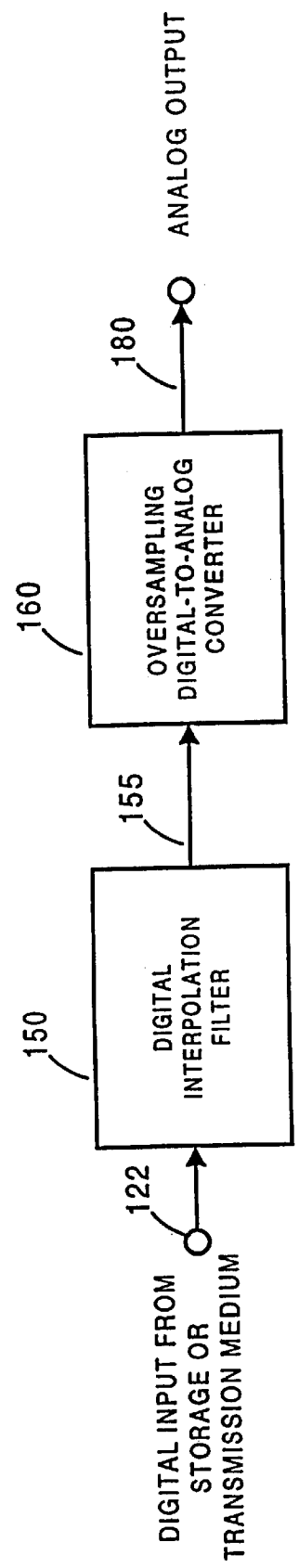
FIG. 1b is a block diagram of a prior-art digital-to-analog (D-to-A) converter.
Figure 2A:
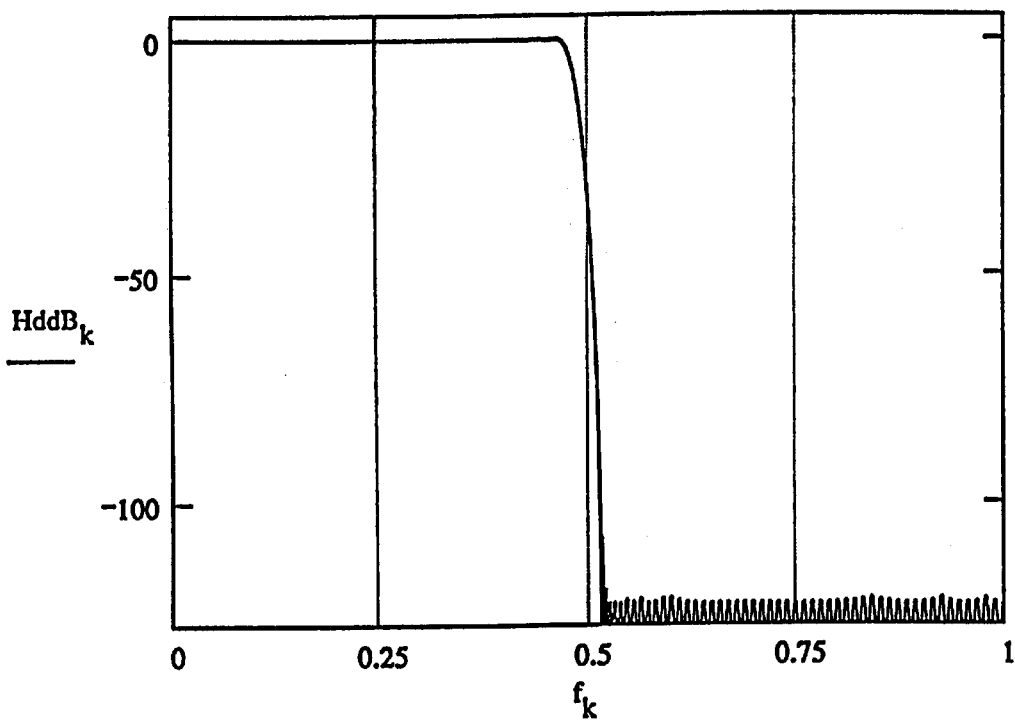
FIG. 2a depicts the frequency response of a typical filter used in an A-to-D converter as the final decimation filter.
Figure 2B:
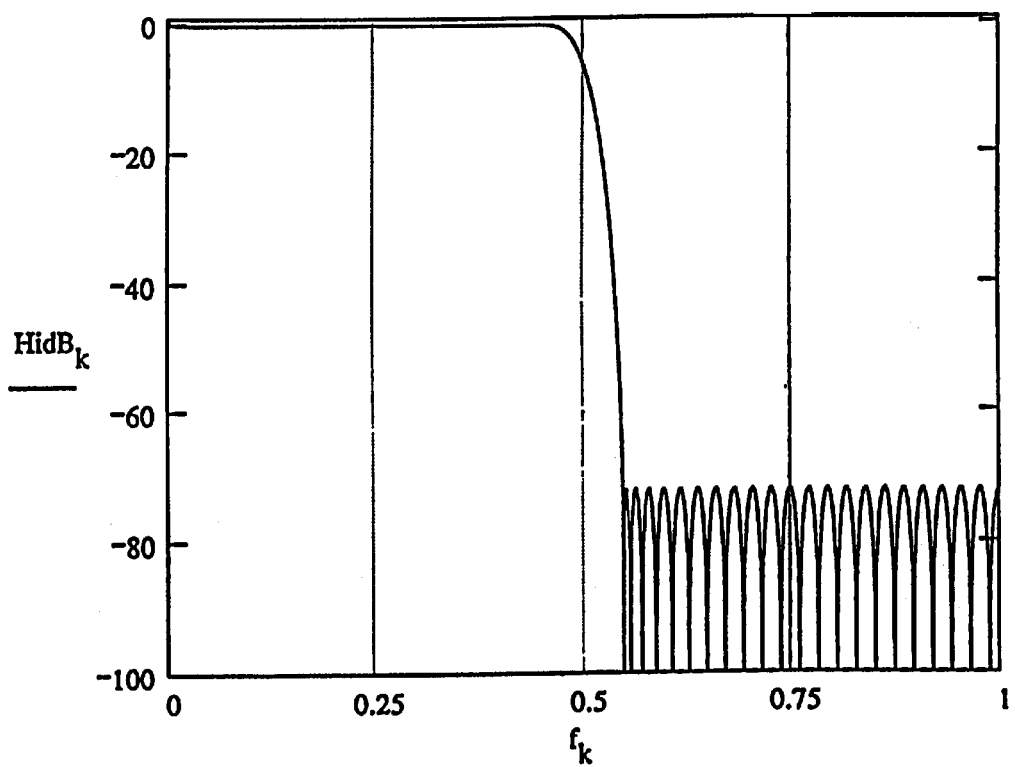
FIG. 2b depicts the frequency response of a typical half-band filter used in a D-to-A converter as the first interpolation filter.
Figure 3A:
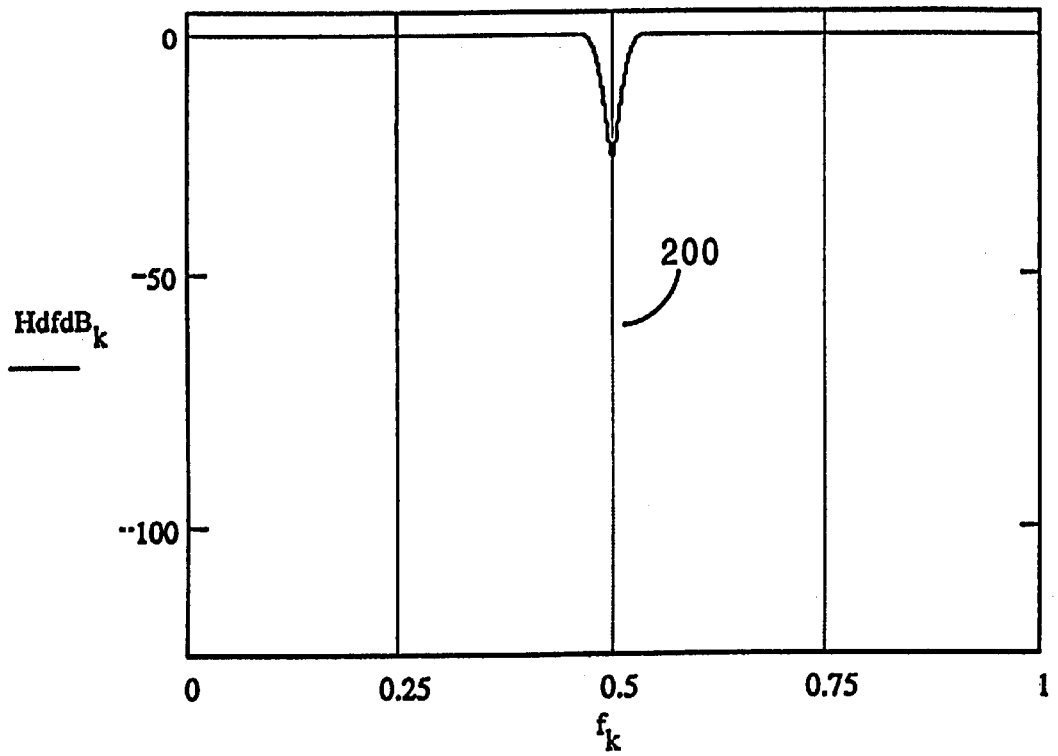
FIG. 3a depicts the frequency response obtained by taking the frequency response of the A-to-D decimation filter in FIG. 2a and performing the equivalent decimation followed by inserting the zero value samples prior to the interpolation filter.
Figure 3B:
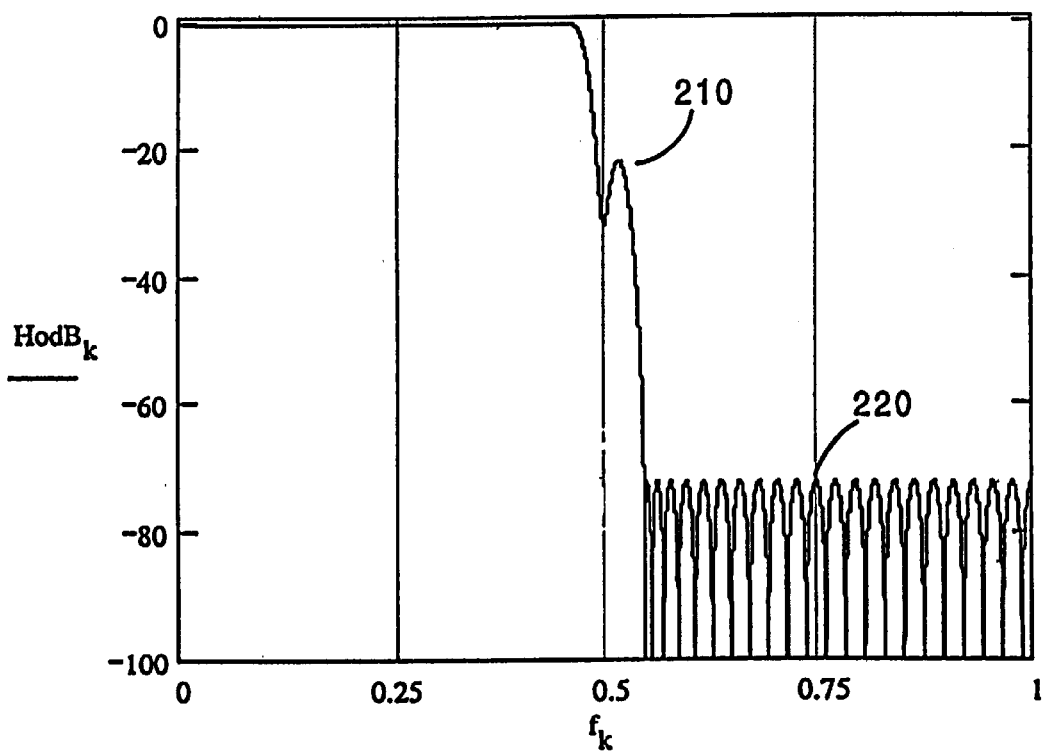
Figure 5B:
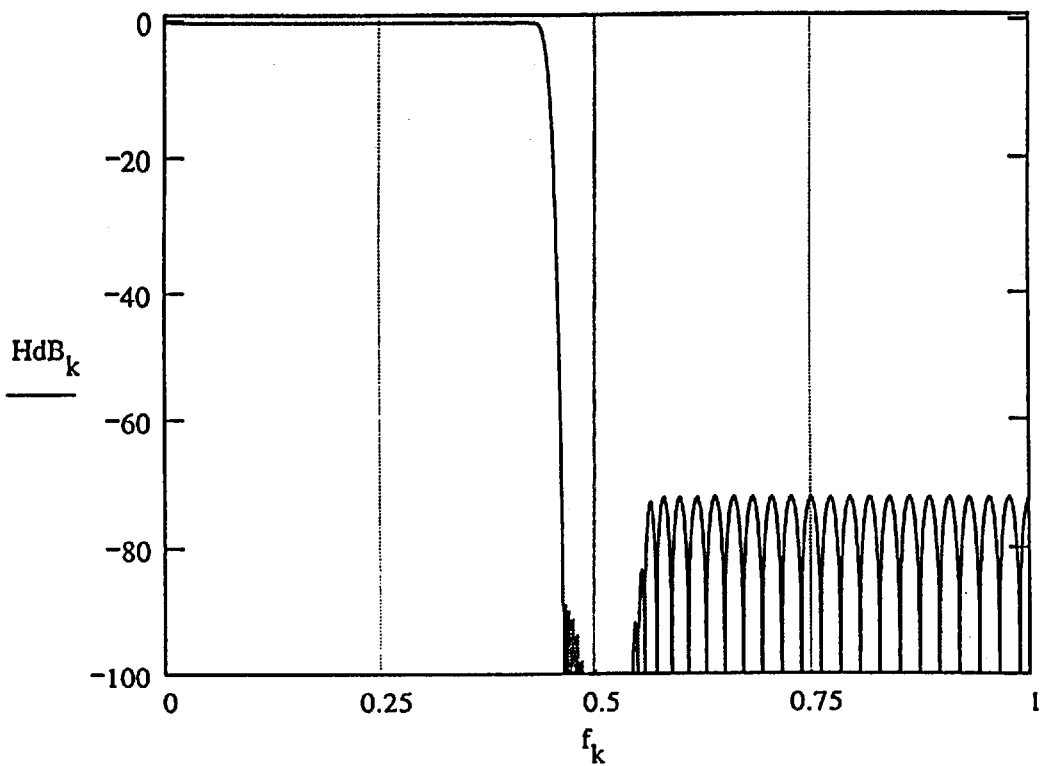
FIG. 5b depicts the frequency response obtained by cascading the frequency response of FIG. 5a with the frequency response of FIG. 3b.

When this filter response is cascaded with the earlier cascade of the decimation and interpolation filters in FIG. 3b, the response of FIG. 5b results. Notice that the transition band alias response 210 in FIG. 3b is effectively suppressed in FIG. 5b, eliminating the alias distortions arising from the use of a half-band filter.

The alias response 220 (FIG. 3b) corresponding to the stop-band of the interpolation filter is not altered by the added alias correction filter 130, since a filter operating at 1xFs cannot change that area of the response while maintaining in-band performance. The only way that the stop-band related problems could be fixed is by using a filter at a higher sampling rate.

Our listening tests indicate that the transition band alias distortion 210 is much more audible than the higher frequency, lower amplitude distortions from the stop-band range 220. The introduction of the alias correction filter 130 (FIG. 4) can dramatically improve the sound of the system.

In order to suppress the alias distortion products in the transition region of the interpolation filter, it is necessary to remove some of the frequencies at the top of the normal response of the original system, as explained above. The added alias correction filter 130 is a low-pass filter. In systems with CD or higher sampling rates, the loss of frequencies at about 20 kilohertz and higher is not usually sonically significant. There is, however, another phenomenon which may sound like the loss of high frequency resolution that is actually caused by a different mechanism having to do with dispersion of transient energy over time. We have referred to this as time smear.

If one takes the inverse Fourier transform of the cascaded frequency response in FIG. 3b, one gets an equivalent impulse response of the cascaded system. From a listener's point of view, this is much more important than the impulse responses of the filters individually, since it is the combination of filters that the signal is actually going through. If one examines the cascaded impulse response on a normal linear scale, it looks very much like the text book responses of the individual filters. Normal linear plots do not reveal much information that correlates to listening experiences.

If, however, one plots the magnitude of the impulse response on a logarithmic scale, one can see some very interesting results, which do correlate with listening tests. The response of human hearing is logarithmic. A plot of this type for a simple decimation and interpolation filter combination like FIG. 3b is plotted in FIG. 6a. The vertical axis is the amplitude in dB with reference to full scale, and the horizontal axis is in samples. This can be thought of as the response of the system in time to a single impulse of unity amplitude (0 dB). Notice that the energy in the system response to a single impulse spike is spread over many samples in time. If one assumes that this is a CD example with a sampling frequency of 44.1 kHz, the spread in time at the point where the plot is 50 dB below full scale is about 3 milliseconds. This time corresponds to physical dimensions of roughly one meter, given the speed of sound in air. If the source of the sound was originally smaller, such as a wood block percussion instrument, the spreading in time or time smear will alter the sound as reproduced by the system in a way that sounds like a loss of high frequency resolution.

When one adds the 1xFs alias correction filter 130 (FIG. 4), one is adding another impulse response to the cascade. Since this is equivalent to the convolution of the impulse response of the new filter with the impulse response of the previous combination, the total length of the impulse response is greater. This does not have to mean that it will sound worse. The part of the response curve which is most significant sonically is the region above about minus 80 dB. It is possible to pick a filter design which has less time dispersion at higher amplitudes and more dispersion at very low amplitudes, which sounds as if it has better high frequency resolution than the system without the added alias correction filter. An example of a response with this character is shown in FIG. 6b.

Figure 6A:
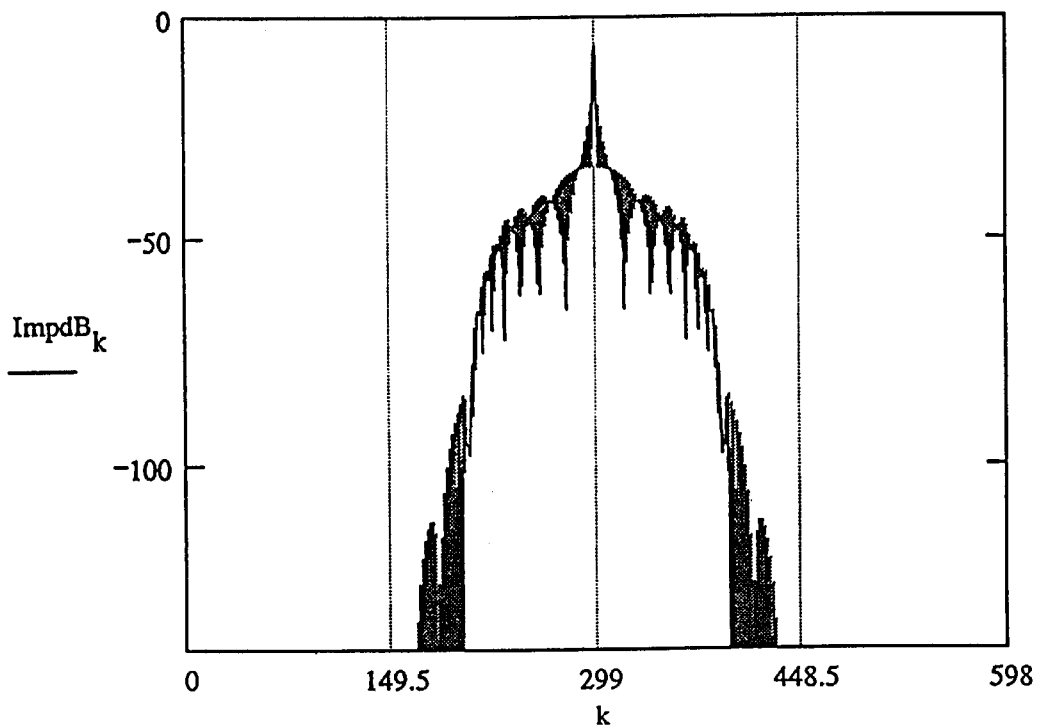
FIG. 6a depicts the impulse response of the cascaded filters of FIG. 3b plotted on a logarithmic scale.
Figure 6B:
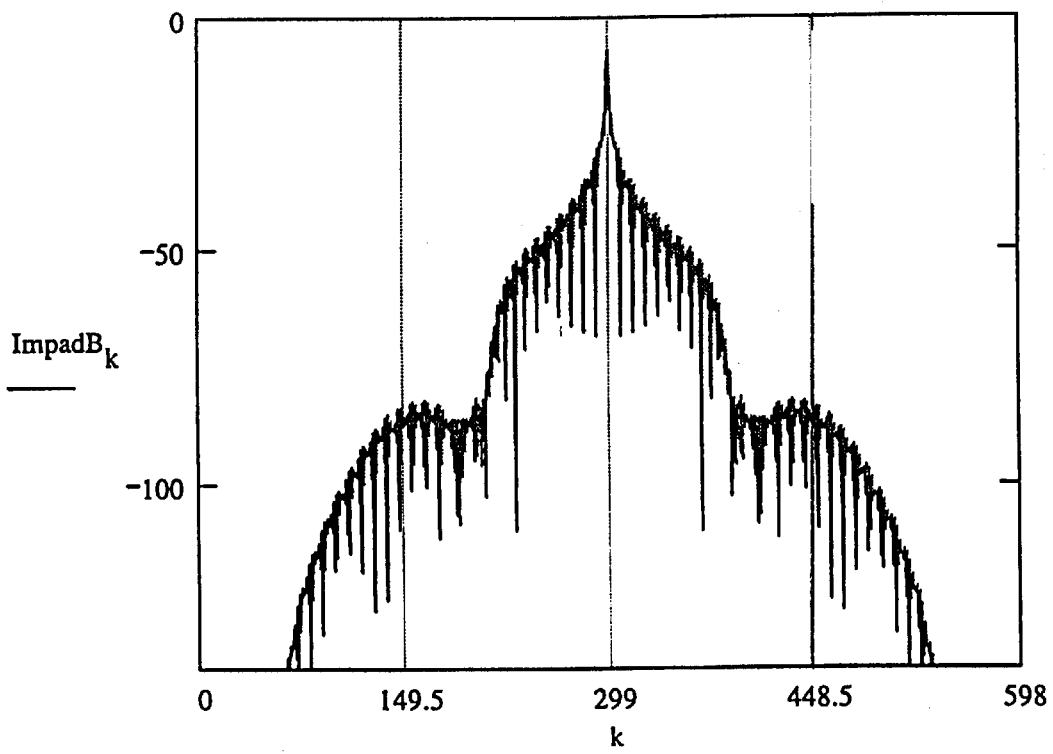
FIG. 6b depicts the impulse response of the cascaded filters of FIG. 5b plotted on a logarithmic scale.

The plot in FIG. 6b is the same decimation/interpolation filter pair as in FIG. 6a, cascaded with the alias correction filter of FIG. 5a. Notice that the width of the plot above −75 dB in FIG. 6b is narrower than the corresponding section of FIG. 6a. The combination of filters in FIG. 6b actually sounds as if it has better high frequency response than FIG. 6a even though it actually has less high frequency components because of the low pass filter. It also sounds much less distorted because the alias distortion from the transition region has been suppressed.

It is very important when designing these alias correction filters 130 (FIG. 4) to examine the result in both the frequency and time domains, because both views show aspects of the design with sonic consequences. Frequently, the two views are at odds with each other. It is easy to solve one problem, such as alias distortion, by introducing another, time dispersion. The final choice is often a tradeoff that must be resolved with listening tests.

The combination of the 1×Fs alias correction filter 130 with a half-band interpolation filter 150 and D-to-A converter 160 is frequently more economical to implement than the more complex non-half-band filter approach of the prior art. In many modern audio components for consumer use, there is a general-purpose digital signal processing (DSP) function plus an integrated filter/D-to-A converter which uses a half-band filter. Examples are DVD players and A/V receivers that use DSP functions to decode compressed audio and for other functions such as bass management. Frequently, there is enough extra processing power in the DSP to add the alias correction filter to the system without changing any hardware except the program ROM for the DSP. The invention allows systems designers to use the same standard integrated filter/D-to-A converter and gain the advantage of a better quality conversion with lower alias distortion.

The use of an alias correction filter 130 at the input sampling frequency of a D-to-A converter to reduce its alias distortion is believed to be new and novel. The nature of transition band alias distortions 210 does not seem to be well understood in the current literature, and is not reflected in current system designs except those employing HDCD, i.e., the prior cited U.S. patents. Also, the method of analysis of the frequency and time domain behavior of cascaded decimation/interpolation filter systems set forth above and its use in designing interpolation filters or alias correction filters is believed to be unique.

Figure 7:
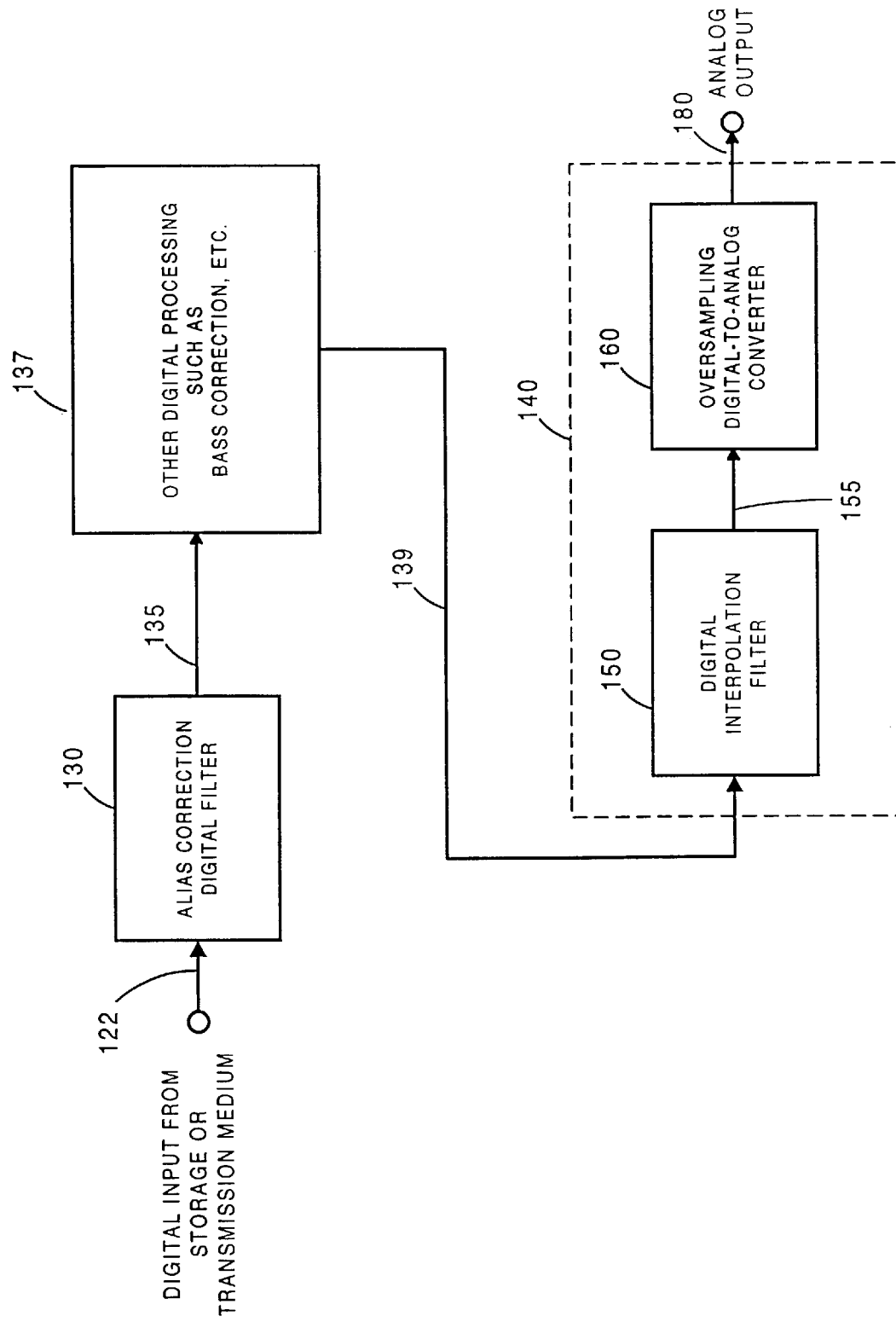
FIG. 7 is a block diagram of a system in accordance with the present invention in which other digital signal processing occurs between alias correction filtering and D-to-A conversion.

The examples so far have covered the simple case of an alias correction filter 130 connected directly to the interpolation filter 150 and D-to-A converter 160. There are many possible variations of the basic structure of the invention that have the same basic functionality. One possible variation is shown in FIG. 7. In this case, the alias correction filter 130 is inserted in the data stream at the input 122 and then other digital processing 137 is done on the signal before it goes to the interpolation filter. This other processing 137 can include bass management, spatial effects, tone controls, reverb, etc. without changing the essence of the invention. Since the behavior of the alias correction is based on the cascaded filters of the system, adding other processing is possible anywhere in the chain without altering the basic behavior of the corrective effect.

Figure 8:
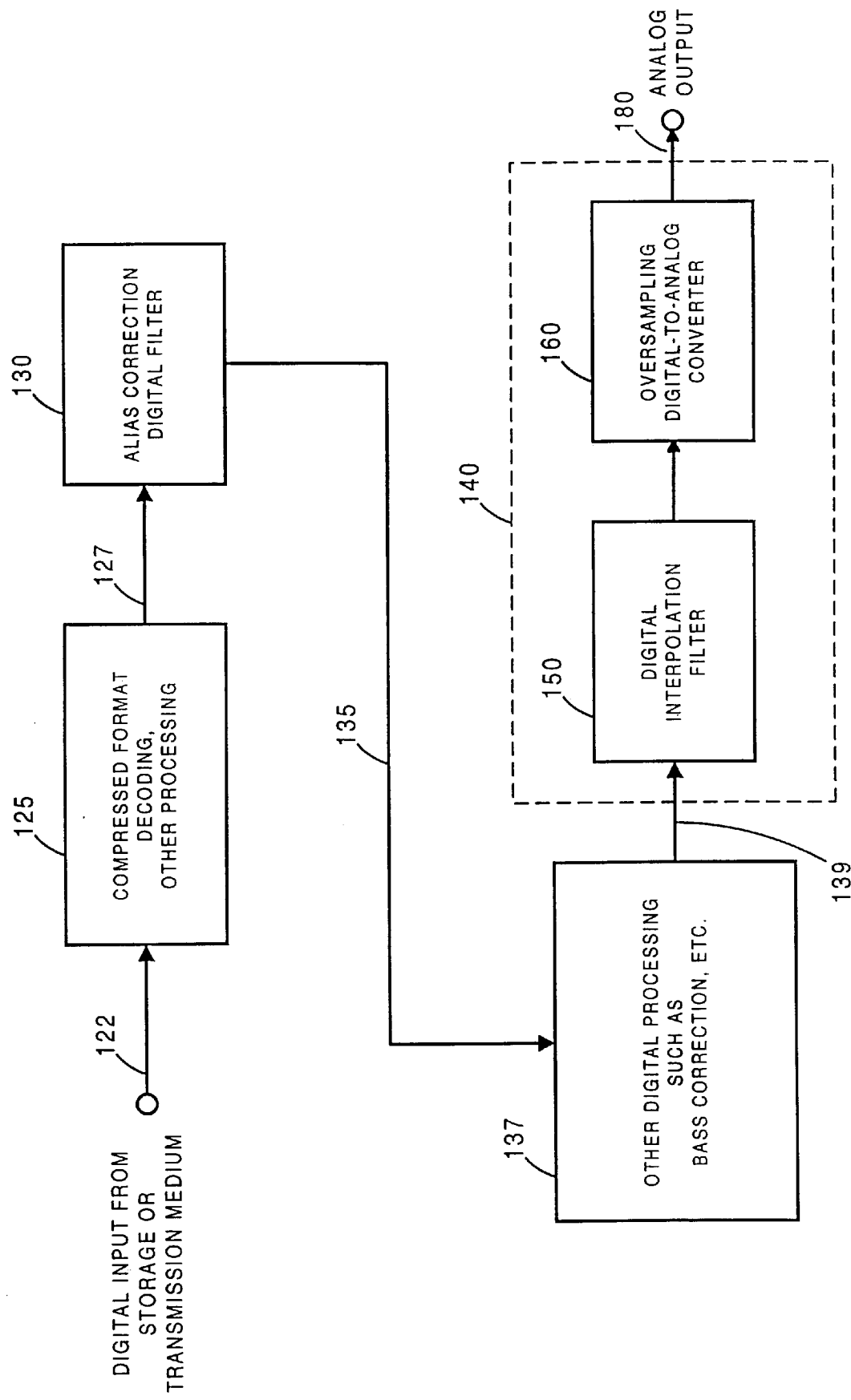
FIG. 8 is a block diagram of a system in accordance with the present invention in which data decoding and/or expansion precedes alias correction filtering and D-to-A conversion.

Yet another example is shown in FIG. 8. This is an example of systems in which some form of data compression is used to achieve a higher data storage density. Examples of such systems are AC3, MPEG audio compression, etc. The section of the playback system 125 responsible for decoding or expanding the compressed format must precede the alias correction filter 130. This block may also include other processing before the alias correction filter.

Figure 9:
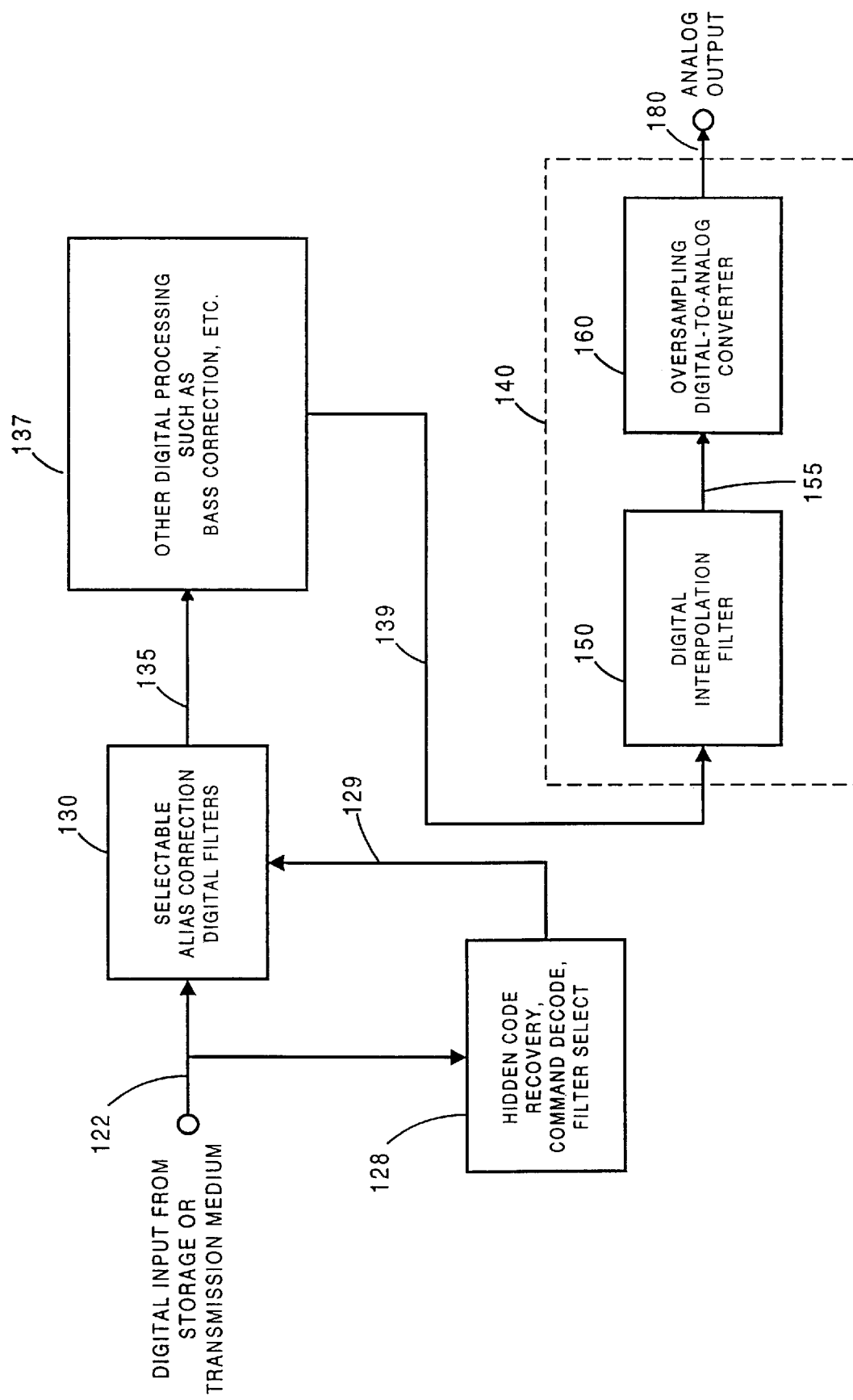
FIG. 9 is a block diagram of a system in accordance with the present invention in which the alias correction filter is selected from a plurality of alias correction filters based on a hidden code carried by the digital signal.

FIG. 9 shows an example of a form of HDCD system according to the prior art described in the previously referenced U.S. patents. In this system, the decimation filter used in the encoder is selected dynamically for best fidelity based on the content of the program material. Since the alias correction filter 130 design is optimally based on both the decimation filter and the interpolation filter 150 used, and since the choice of decimation filter is conveyed to the reproducer via a hidden code side channel, the alias correction filter can be selected dynamically to give the best complement to the decimation filter at any given time. This is accomplished by a hidden code/filter select device 128, which recovers the hidden code information, decodes the commands contained in the hidden code, and selects one of several alias correction filters 130 using a control signal 129.

Figure 10:
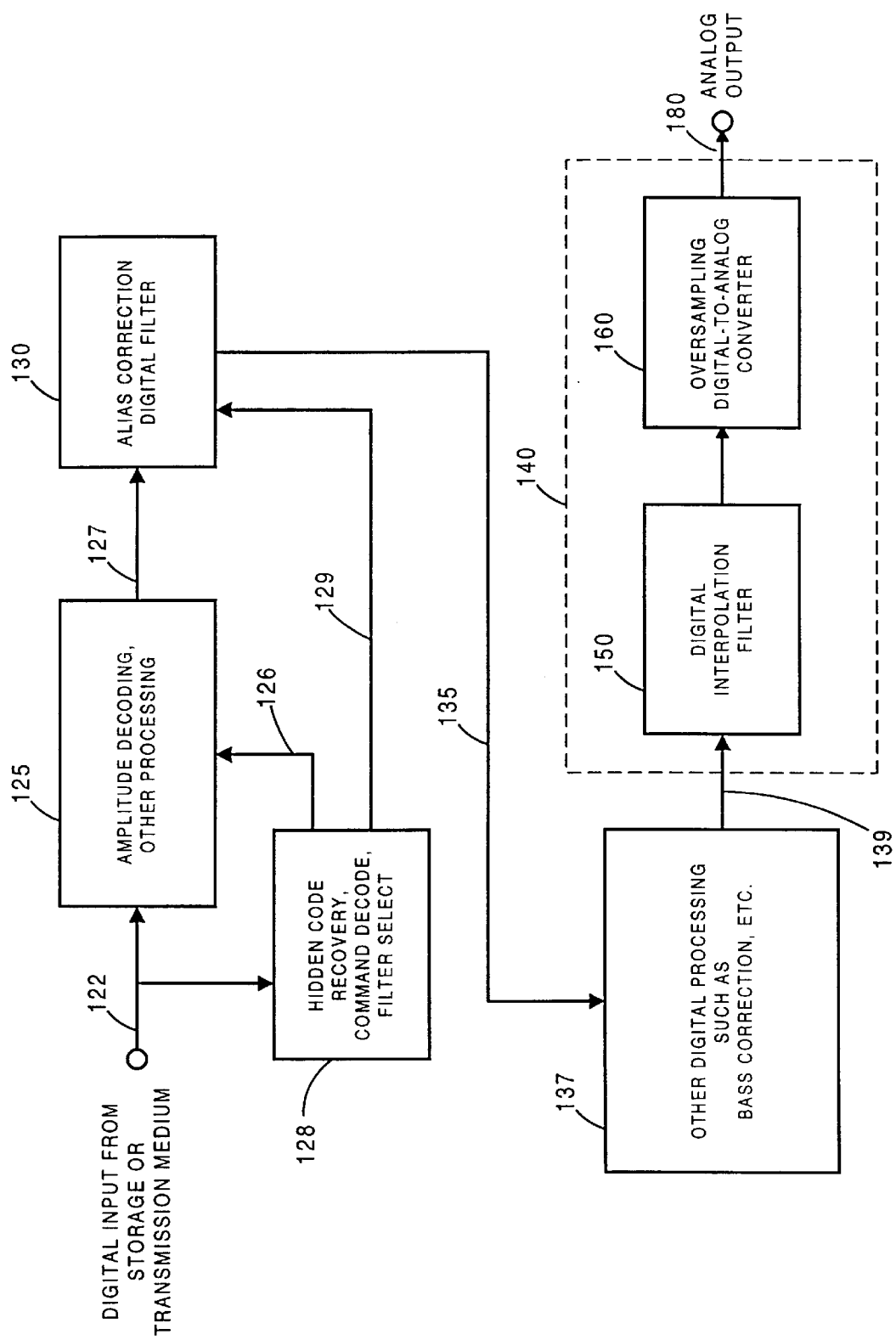
FIG. 10 is a block diagram of a system in accordance with the present invention in which other selectable signal processing precedes selectable alias correction filtering, wherein both selections are based on a hidden code carried by the digital signal.

FIG. 10 is another example of an HDCD system similar to FIG. 9 with the addition of the HDCD amplitude decoder 125. The function of the amplitude decoder is also controlled by the hidden code side channel via the code command decoder 128 and control signal 126. In this system, the amplitude decoding must be done before the alias correction filter 130 in order for the decoding to track the encoding properly.

Although the alias correction filter 130 described above is a symmetrical FIR filter, which has linear phase characteristics, other types of filters could be used to accomplish the same goal. One possible type is a minimum phase IIR (infinite impulse response) filter. This type of filter has the time domain characteristic that the filter ringing occurs after the transient event that caused it. This would probably have a better time domain behavior from an audibility standpoint, although the phase shift near the band edge might cause other perceptual problems.

The example filters used in the discussion so far have been designs used for CD players and other systems with sampling rates between 40 and 50 kHz. The invention is also useful for high-resolution systems with higher sampling rates, such as DVD Audio, which allows sampling rates up to 192 kHz. As the sampling rate is increased by an octave or two, the transition band alias 210 problems are still an issue. Half-band interpolation filters are still the norm for most audio systems designs, and the signal frequency component—alias frequency component pairs can still cause difference frequencies in the audio band when they encounter non-linearities down stream in the system. This is true even though the amplitude of audio signals is lower in the transition region of the filters at higher sampling frequencies. We have done listening tests at 88.2 and 96 kHz in which the transition band alias components 210 cause the digital signal to sound very bright, that is sound as if there are much higher levels of high frequencies, when compared to the original signal. Introducing an alias correction filter 130 to the system caused the exaggerated brightness to go away, resulting in a very neutral reproduction of the original.

It will be apparent from the foregoing that, while particular forms of the invention have been illustrated and described, various modifications can be made without departing from the spirit and scope of the invention.

What is claimed is:

1. A method of processing an analog signal comprising the steps of:

converting the analog signal to a digital signal using an analog-to-digital converter;

providing a digital decimation filter having an associated frequency response;

providing a digital interpolation filter having an associated frequency response;

combining the associated frequency response of the digital decimation filter and the associated frequency response of the digital interpolation filter to produce a combined frequency response having a transition band portion;

filtering the digital signal using the digital decimation filter;

attenuating the digital signal in the transition band portion; and subsequently filtering the digital signal using the digital interpolation filter.

2. The method of claim 1 wherein the digital signal is filtered using a series of digital decimation filters and the transition band portion of the frequency response is from the combination of the frequency response of the last digital decimation filter in the decimation-filter series and the frequency response of the digital interpolation filter.

3. The method of claim 1 wherein the digital signal is filtered using a series of digital interpolation filters and the transition band portion of the frequency response is from the combination of the frequency response of the first digital interpolation filter in the interpolation-filter series and the frequency response of the digital decimation filter.

4. The method of claim 1 wherein the digital signal is filtered using a series of digital decimation filters and a series of digital interpolation filters and the transition band portion of the frequency response is from the combination of the frequency response of the last digital decimation filter in the decimation-filter series and the frequency response of the first digital interpolation filter in the interpolation-filter series.

5. The method of claim 1 further comprising the step of performing additional signal processing on the digital signal prior to the step of attenuating the digital signal in a frequency range generally corresponding to the transition band portion.

6. The method of 5 wherein the additional signal processing comprises at least one process selected from the group consisting of bass management, spatial effects, tone control and reverb.

7. The method of claim 1 further comprising the steps of:

performing data compression on the digital signal after the step of filtering the digital signal using a digital decimation filter; and subsequently performing data expansion of the digital signal prior to the step of attenuating the digital signal in a frequency range generally corresponding to the transition band portion.

8. A system for processing an analog signal comprising:

an analog-to-digital converter;

a digital decimation filter having an associated frequency response;

a digital interpolation filter having an associated frequency response;

an alias correction filter having an associated frequency response that attenuates frequencies in a transition band portion, the transition band portion associated with a combined frequency response, the combined frequency response produced by combining the frequency response of said digital decimation filter and the frequency response of said digital interpolation filter; and wherein said analog-to-digital converter converts the analog signal to a digital signal, said digital decimation filter decimates the digital signal, said alias correction filter attenuates the decimated digital signal, and said digital interpolation filter interpolates the decimated and attenuated digital signal.

9. The system of claim 8 wherein said digital decimation filter comprises a series of individual digital decimation filters and the distortion band portion of the combined frequency response is produced by combining the frequency response of the last digital decimation filter in said decimation-filter series and the frequency response of said digital interpolation filter.

10. The system of claim 8 wherein said digital interpolation filter comprises a series of individual digital interpolation filters and the distortion band portion of the combined frequency response is produced by combining the frequency response of the first digital interpolation filter in said interpolation-filter series and the frequency response of said digital decimation filter.

11. The system of claim 8 wherein said digital decimation filter comprises a series of individual digital decimation filters, said digital interpolation filter comprises a series of individual digital interpolation filters and the distortion band portion of the combined frequency response is produced by combining the frequency response of the last digital decimation filter in said decimation-filter series and the frequency response of the first digital interpolation filter in said interpolation-filter series.

12. The system of claim 8 wherein the said digital interpolation filter is a half-band filter and the distortion band portion is near Nyquist.

13. The system of claim 8 wherein the decimated digital signal and the decimated and attenuated digital signal have the same sampling rate.

14. The system of claim 8 further comprising a signal processor responsive to the decimated and attenuated digital signal for providing a decimated, attenuated and processed digital signal.

15. The system of claim 14 wherein said signal processor comprises at least one process selected from the group consisting of a bass manager, spatial effector, tone controller and reverberator.

16. The system of claim 8 further comprising:

a data compressor responsive to the decimated digital signal for performing data compression on the signal; and a data expander responsive to the decimated and compressed digital signal for performing data expansion on the signal.

17. A method of processing a decimated digital signal converted from an analog signal using a digital decimation filter having an associated frequency response, the method comprising the steps of:

providing a digital interpolation filter having an associated frequency response;

combining the associated frequency response of the digital decimation filter and the associated frequency response of the digital interpolation filter to produce a combined frequency response having a transition band portion;

attenuating the decimated digital signal in the transition band portion; and filtering the decimated and attenuated digital signal through the digital interpolation filter.

18. The method of claim 17 further comprising the step of performing additional signal processing on the decimated and attenuated digital signal.

19. The method of 18 wherein the additional signal processing comprises at least one process selected from the group consisting of bass correction, spatial effects, tone control and reverberation.

20. The method of claim 17 further comprising the steps of:
performing data compression on the decimated digital signal; and
subsequently performing data expansion of the decimated and compressed digital signal.

21. The method of claim 17 wherein at least one of a plurality of signal processing characteristics are encoded in the decimated digital signal and the method further comprises the step of decoding at least one of the at least one signal processing characteristics prior to the step of attenuating, wherein the at least one signal processing characteristic is selected from the plurality of signal processing characteristics based on a hidden code carried by the decimated digital signal.

22. The method of claim 21 wherein the signal processing characteristic comprises amplitude decoding.

23. A system for processing a decimated digital signal converted from an analog signal using a digital decimation filter having an associated frequency response, said system comprising:
a digital interpolation filter having an associated frequency response; and
an alias correction filter having an associated frequency response that attenuates frequencies in a transition band portion, the transition band portion associated with a combined frequency response, the combined frequency response produced by combining the frequency response of said digital decimation filter and the frequency response of said digital interpolation filter; and
wherein said alias correction filter attenuates the decimated digital signal and said digital interpolation filter interpolates the decimated and attenuated digital signal.

24. The system of claim 23 further comprising a signal processor responsive to the decimated and attenuated signal for providing a decimated, attenuated and processed signal.

25. The system of claim 24 wherein said signal processor comprises at least one process selected from the group consisting of a bass correcter, spatial effector, tone controller and reverberator.

26. The system of claim 23 further comprising:
a data compressor responsive to the decimated digital signal for performing data compression on the decimated digital signal; and
a data expander responsive to the compressed and decimated digital signal for performing data expansion on the compressed and decimated digital signal.

27. A method of processing a decimated digital signal converted from an analog signal using an analog-to-digital converter and decimated using a digital decimation filter selected from a plurality of digital decimation filters, each digital decimation filter having an associated frequency response, the digital decimation filter selected based on a hidden code carried by the converted signal, the method comprising the steps of:
providing a digital interpolation filter having an associated frequency response;
providing a plurality of individually selectable alias correction filters, each alias correction filter having an associated frequency response that attenuates frequencies in a transition band portion, the transition band portion associated with a combined frequency response, the combined frequency response produced by combining the frequency response of the selected digital decimation filter and the frequency response of the digital interpolation filter;
selecting one of the alias correction filters based on the hidden code;
attenuating the decimated digital signal in the transition band portion using the selected alias correction filter; and
filtering the decimated and attenuated digital signal using the digital interpolation filter.

28. The method of claim 27 further comprising the step of performing additional signal processing on the decimated and attenuated digital signal.

29. The method of claim 28 wherein the additional signal processing comprises at least one process selected from the group consisting of bass correction, spatial effects, tone control and reverb.

30. The method of claim 27 wherein at least one of a plurality of signal processing characteristics are encoded in the decimated digital signal and the method further comprises the step of decoding at least one of the at least one signal processing characteristics prior to attenuating, wherein the at least one signal processing characteristic is selected from the plurality of signal processing characteristics based on said hidden code carried by the decimated digital signal.

31. The method of claim 30 wherein the signal processing characteristic comprises amplitude decoding.

32. A system for processing a decimated digital signal converted from an analog signal using an analog-to-digital converter and decimated using a digital decimation filter selected from a plurality of digital decimation filters, each digital decimation filter having an associated frequency response, said digital decimation filter selected based on a hidden code carried by the converted signal, said system comprising:
a digital interpolation filter having an associated frequency response;
a plurality of individually selectable alias correction filters, each alias correction filter having an associated frequency response that attenuates frequencies in a transition band portion, the transition band portion associated with a combined frequency response, the combined frequency response produced by combining the frequency response of said selected digital decimation filter and the frequency response of said digital interpolation filter;
a selector responsive to said hidden code for selecting one of said alias correction filters; and
wherein said selected alias correction filter is responsive to the decimated digital signal.

33. The system of claim 32 further comprising a signal processor responsive to the decimated and attenuated digital signal.

34. The method of claim 33 wherein the signal processor comprises at least one process selected from the group consisting of a bass corrector, spatial effector, tone controller and reverberator.

35. The system of claim 32 wherein at least one of a plurality of signal processing characteristics are encoded in the decimated digital signal and said system further comprises a decoder responsive to the decimated digital signal prior to said selected alias correction filter and responsive to said hidden code for decoding said signal processing characteristic from the decimated digital signal wherein said at least one of said at least one signal processing characteristics is selected from said plurality of signal processing characteristics based on said hidden code carried by the decimated digital signal.

36. The system of claim 35 wherein at least one of said selected signal processing characteristics comprises amplitude decoding.

37. A method of designing a filter for reducing alias distortion for use in processing a digital signal converted from an input analog signal using an analog-to-digital converter comprising a digital decimation filter, the digital signal subsequently converted to an output analog using a digital-to-analog converter comprising a digital interpolation filter, the decimation filter having an associated frequency response and the interpolation filter having an associated frequency response, the method comprising the steps of:

a) locating a distortion band portion, the distortion band portion associated with a combined frequency response, the combined frequency response produced by combining the frequency response of the digital decimation filter and the frequency response of the digital interpolation filter;

b) selecting a first attenuation filter having a frequency response that attenuates the digital signal in a frequency range generally corresponding to the distortion band portion;

c) convolving impulse responses of the decimation filter and the interpolation filter to produce a first impulse response having an associated time dispersion;

d) convolving impulse responses of the decimation filter, the attenuation filter and the interpolation filter to produce a second impulse response having an associated time dispersion and in a most sonically significant region;

e) comparing the time dispersion of the second impulse response in the most sonically significant region with the time dispersion of the first impulse response in the same region;

f) if the width of the second-impulse-response time dispersion in the most sonically significant region is generally greater than the width of the first-impulse-response time dispersion in the same region, selecting another attenuation filter having a frequency response different than the first frequency response, that attenuates the digital signal in the frequency range generally corresponding to the distortion band portion; and g) repeating steps d, e and f until the width of the second-impulse-response time dispersion in the most sonically significant region is no greater than the width of the first-impulse-response time dispersion in the same region.

38. The method of claim 37 wherein the convolved impulse response is plotted on a logarithmic scale.

39. The method of claim 37 wherein the most sonically significant region of the first and second impulse responses is generally within a region above approximately minus 80 dB.

40. The method of claim 37 wherein higher amplitude regions of the first and second impulse responses are more sonically significant.

* * * * *

UNITED STATES PATENT AND TRADEMARK OFFICE
CERTIFICATE OF CORRECTION

PATENT NO. : 6,337,645 B1
DATED : January 8, 2002
INVENTOR(S) : Pflaumer

It is certified that error appears in the above-identified patent and that said Letters Patent is hereby corrected as shown below:

<u>Column 1,</u>
Line 19, replace "modem" with -- modern --.
Line 59, replace "stream,in the" with -- stream. In the --

Signed and Sealed this

Eighteenth Day of February, 2003

JAMES E. ROGAN
*Director of the United States Patent and Trademark Office*